(12) United States Patent
Lee et al.

(10) Patent No.: US 6,776,819 B2
(45) Date of Patent: Aug. 17, 2004

(54) GAS SUPPLYING APPARATUS AND METHOD OF TESTING THE SAME FOR CLOGS

(75) Inventors: Seung-Woo Lee, Ohsan (KR); Min-Gyoo Lim, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 10/246,627

(22) Filed: Sep. 19, 2002

(65) Prior Publication Data

US 2003/0106494 A1 Jun. 12, 2003

(30) Foreign Application Priority Data

Dec. 12, 2001 (KR) .......................................... 2001-78578

(51) Int. Cl.[7] .............................................. B01D 53/22
(52) U.S. Cl. ........................................... 95/45; 340/626
(58) Field of Search ............................... 95/45; 340/626

(56) References Cited

U.S. PATENT DOCUMENTS 5,554,976 A * 9/1996 Miyauchi et al. ........... 340/626
6,132,492 A * 10/2000 Hultquist et al. .............. 95/45

FOREIGN PATENT DOCUMENTS

KR  1999-0041454  12/1999

* cited by examiner

Primary Examiner—John F. Niebling
Assistant Examiner—Andre' C. Stevenson
(74) Attorney, Agent, or Firm—Volentine Francos, PLLC

(57) ABSTRACT

A gas supplying apparatus of a system for fabricating semiconductor devices is tested for clogs. The gas supplying apparatus includes a carrier gas supplying device for supplying at least one carrier gas, and a plurality of reactive gas supplying devices connected in parallel to the carrier gas supplying device. The reactive gas supplying devices gasify the reactive gas carried by the carrier gas. A wafer, on which a desired layer is to be formed, is situated in a process chamber into which the reactive gas is supplied from the reactive gas supplying devices. The gas supplying apparatus also includes pressure detecing devices for detecting the pressure of the carrier gas near each of the reactive gas supplying devices. The carrier gas is supplied under a predetermined pressure to the reactive gas supplying devices. The reactive gas supplying device to be tested for clogs is rendered operational while the other reactive gas supplying devices are shut down. The pressure of the carrier gas near an outlet of the carrier gas supplying device is compared to the pressure of the carrier gas near an inlet of the reactive gas supplying device being tested to determine if the device is clogged.

8 Claims, 4 Drawing Sheets

GAS SUPPLYING APPARATUS AND METHOD OF TESTING THE SAME FOR CLOGS

BACKGROUND OF THE INVENTION

1. Field of the Invention

The present invention relates to a gas supplying apparatus of a semiconductor fabrication system and to a method of testing the same. More particularly, the present invention relates to the testing of an injection valve of a gas supplying apparatus of the system for clogs.

2. Description of the Related Art

A plurality of gases are used to fabricate semiconductor devices, particularly in a chemical vapor deposition (CVD) process. For example, reactive gases such as Tetra-Ethyl-Ortho Silicate (TEOS), Tri-Ethyl-Phosphorus (TEPO) and Tri-Ethyl-Boron (TEB) are used and supplied into a process chamber of a CVD apparatus to form a planarization layer such as Boron-Phosphorus-Silicate Glass (BPSG) or a Phosphorus-Silicate Glass (PSG) layer. The reactive gases, namely the TEOS, TEPO and TEB, are supplied to the process chamber using a gas supplying apparatus which is installed at an external part of the chamber.

A conventional gas supplying apparatus includes a carrier gas supplying device for applying pressure to the reactive gases using a carrier gas such as $N_2$, $H_2$, and three injection valves connected in series to each other for gasifying liquid phases of the reactive gases and supplying the same to the process chamber. The gasified reactive gases are then supplied to the process chamber after being mixed with each other.

In this apparatus, the injection valve associated with the TEPO is typically the last in the series of the injection valves, and tends to become clogged from time to time. Such clogging was deemed to occur due to chemical characteristics of the TEPO or due to a reaction among the reactive gases. In the latter case, a reaction occurs because the injection valves are connected in series, whereby the reactive gases are mixed with each other before being introduced into the process chamber.

A study for solving the problem of injection valve clogging is disclosed in Korean Utility Model Laid-Open Publication No. 1999-0041454. In the study, each of injection valves was connected in parallel and a Mass Flow Controller (MFC) was installed in each of the valve lines.

However, injection valve clogging is still observed in the modified apparatus disclosed in the Korean Utility Model Laid-Open Publication No. 1999-004145. Therefore, it is assumed that the clogging is caused by the chemical characteristics of the TEPO rather than a reaction among the reactive gases.

In the modified apparatus, the reactive gases are provided into the reaction chamber at a predetermined ratio by the mass flower meters and liquid flow meters. However, the reaction gases are supplied into the process chamber at an incorrect concentration ratio if at least one injection valve is clogged. Obviously, then, a desired layer can not be formed when one or more of the injection valves is clogged.

SUMMARY OF THE INVENTION

It is therefore an object of the present invention to provide a semiconductor device fabrication system whose reactive gas supplying device(s) can be tested for clogs before the reactive gas(es) is/are supplied into the process chamber. Likewise, it is an object of the present invention to provide a method of testing a reactive gas supplying device(s) of a gas supplying apparatus for clogs.

It is another object of the present invention to provide a gas supplying apparatus having a reactive gas supplying device whose gas injection valve can be tested for clogs. Likewise, it is an object of the present invention to provide a method of testing a gas injection valve for clogs.

A gas supplying apparatus of the present invention includes a carrier gas supplying device for supplying a carrier gas under a predetermined pressure, at least one reactive gas supplying device connected in parallel to each other, and a pressure detecting device installed between the carrier gas supplying device and each reactive gas supplying device for detecting the pressure of the carrier gas as it enters a reactive gas supplying device, The pressure detecing device preferably is a mass flow meter. However, the pressure detecting device can be a pressure guage. The reactive gas(es) supplied from the reactive gas supplying device(s) are introduced into a process chamber in which a wafer is situated to produce a desired layer on the wafer.

When the gas supplying apparatus includes a plurality of reactive gas supplying devices, a respective switching valve is disposed between the pressure detecting device and each reactive gas supplying device. Each reactive gas supplying device may include a source of reactive gas in its liquid phase, and an injection valve for adjusting flow rate of the reactive gas and gasifying the reactive gas. Preferably, the reactive gas supplying devices include a TEOS gas supplying device, a TEB gas supplying device, and a TEPO gas supplying device.

The carrier gas is supplied under a predetermined pressure from the carrier gas supplying device to a reactive gas supplying device. The pressure of the carrier gas adjacent an inlet of the reactive gas supplying device is detected by the pressure detecting device. The pressure of the carrier gas detected adjacent the inlet of the reactive gas supplying device is then compared to a first pressure corresponding to the pressure (detected or predetermined) under which the carrier gas is flowing from the carrier gas supplying device.

In the case of a plurality of reactive gas supplying devices, a reactive gas supplying device to be tested is rendered operational while the other reactive gas supplying device(s) is/are shut down. In particular, the switching valve associated with the reactive gas supplying device to be tested is in an ON position, thereby allowing carrier gas from the carrier gas supply device to flow thereto. On the other hand, the switching valve(s) associated with the other reactive gas supplying device(s) is/are in the OFF position.

Comparing the first pressure of the carrier gas detected or otherwise determined at the side of the carrier gas supplying device (adjacent the outlet thereof) with the second pressure of the carrier gas detected at at the side of the reactive gas supplying device (adjacent the inlet of the gas injection valve) yields an indication of whether the reactive gas supplying device being tested is clogged. In operating the semiconductor fabrication system, the reactive gas entrained by the carrier gas is allowed to flow into the process chamber to process the wafer only when the first detected pressure is equal to or less than the second pressure.

BRIEF DESCRIPTION OF THE DRAWINGS

These and other objects, features, and advantages of the present invention will become apparent from the following detailed description of the preferred embodiments thereof made with reference to the accompanying drawings, of which.

DETAILED DESCRIPTION OF THE PREFFERED EMBODIMENTS

Figure 1:
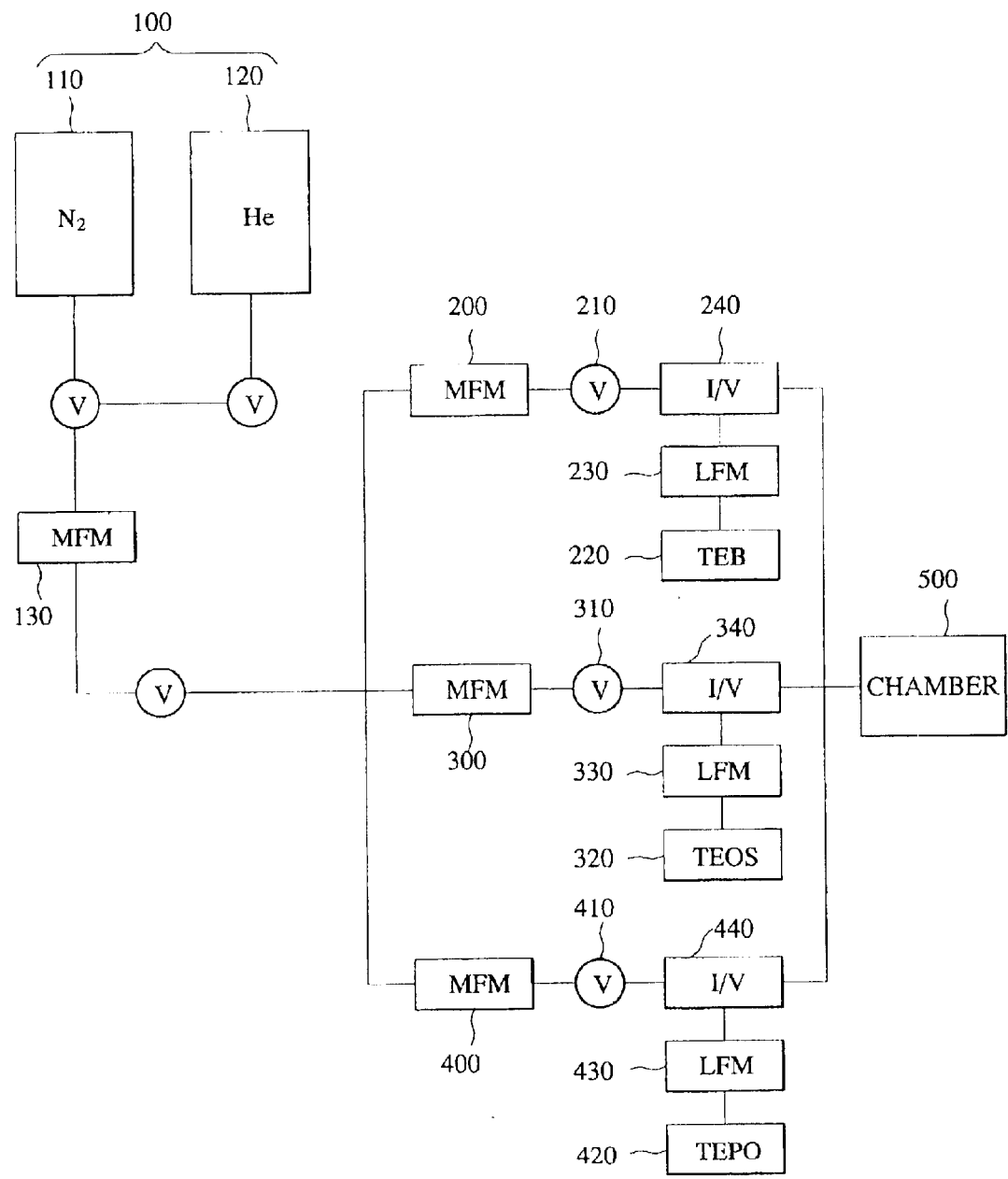
FIG. 1 is a block diagram of a reactive gas supplying device for fabricating a semiconductor device in accordance with the present invention.

As shown in FIG. 1, a gas supplying apparatus in accordance with the present invention includes a carrier gas supplying device 100 for supplying the carrier gas that carries reactive gases into a CVD process chamber 500 through three gas passage lines. The carrier gas supplying device 100 has a $N_2$ gas source 110 and an He gas source 120. The carrier gases $N_2$ and He can be selectively used or used together at the same time.

A mass flow meter 130 displaying the pressure of the carrier gases is installed near the carrier gas supplying device 100. The mass flow meter 130 will be referred to as a first mass flow meter.

The carrier gas line is branched downstream of the first mass flow meter 130. The branches of the carrier gas line are connected to a TEB gas supplying device, a TEOS gas supplying device and a TEPO gas supplying device, respectively. Outlets of the TEB gas supplying device, the TEOS gas supplying device and the TEPO gas supplying device are connected to each other in parallel through a gas passage pipe which, in turn, is connected to the CVD process chamber 500.

The TEB gas supplying device includes a TEB gas source 220 (source of TEB in its liquid phase), a liquid flow meter 230 for displaying and adjusting the flow rate of the liquid TEB supplied from the TEB gas source 220, and an injection valve 240 for gasifying the liquid phase of the TEB.

The TEOS gas supplying device includes a TEOS gas source 320, a liquid flow meter 330 for displaying and adjusting the flow rate of liquid TEOS supplied from the TEOS gas source 320, and an injection valve 340 for gasifying the liquid phase of the TEOS.

The TEPO gas supplying device includes a TEPO gas source 420, a liquid flow meter 430 for displaying and adjusting the flow rate of liquid TEPO supplied from the TEPO gas source 420, and an injection valve 440 for gasifying the liquid phase of the TEPO.

The injection valves 240, 340 and 440 can be a piezo-electric actuating valves that are operable in response to an impressed voltage of a certain level.

The configuration and operation of the piezo-electric injection valve 440 will now be described in more detail with reference to FIGS. 2 and 3. The injection valves 240, 340 have the same configuration and operate the same way as the injection valve 440.

Figure 2:
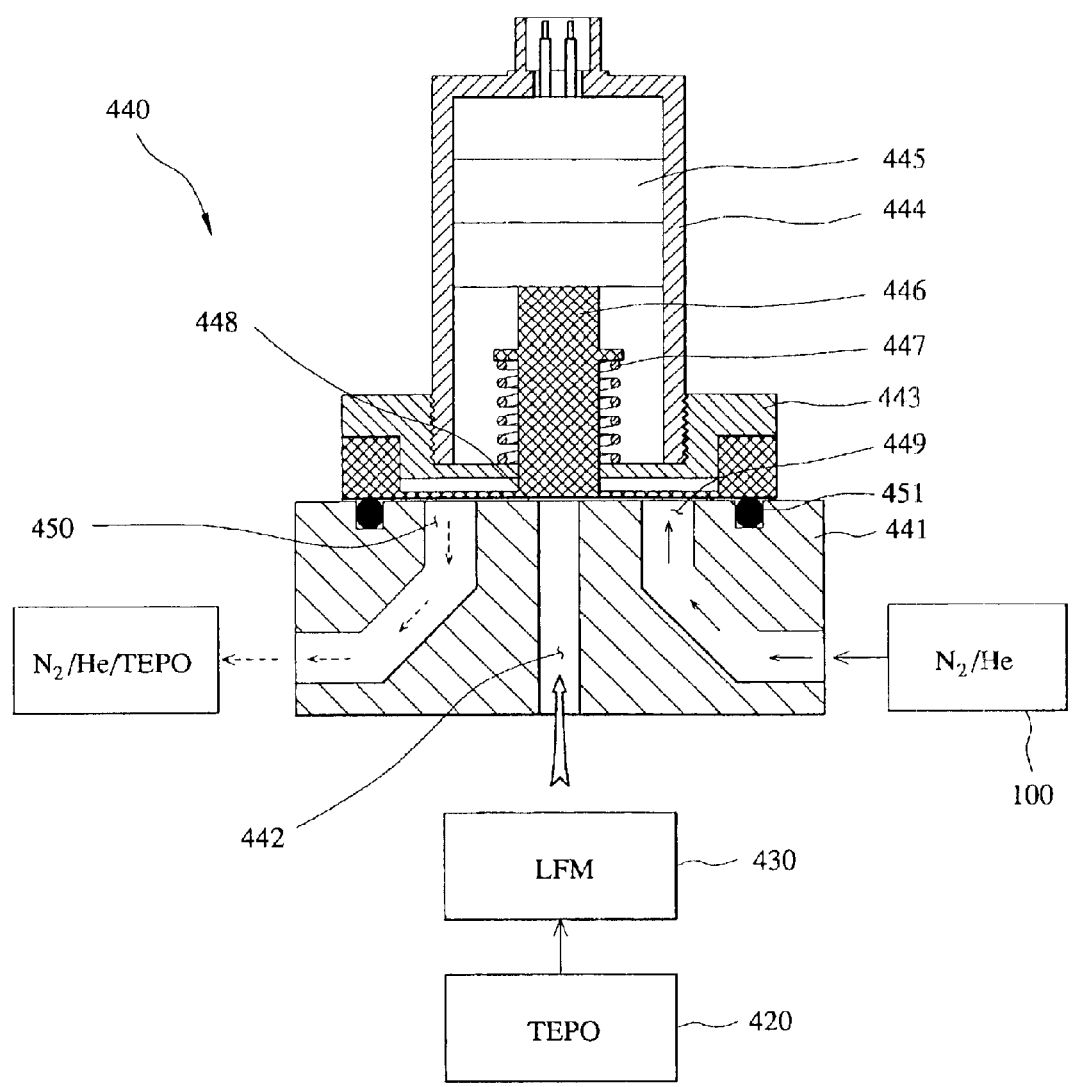
FIG. 2 is a sectional view of an injection valve of the reactive gas supplying device in accordance with the present invention.
Figure 3:
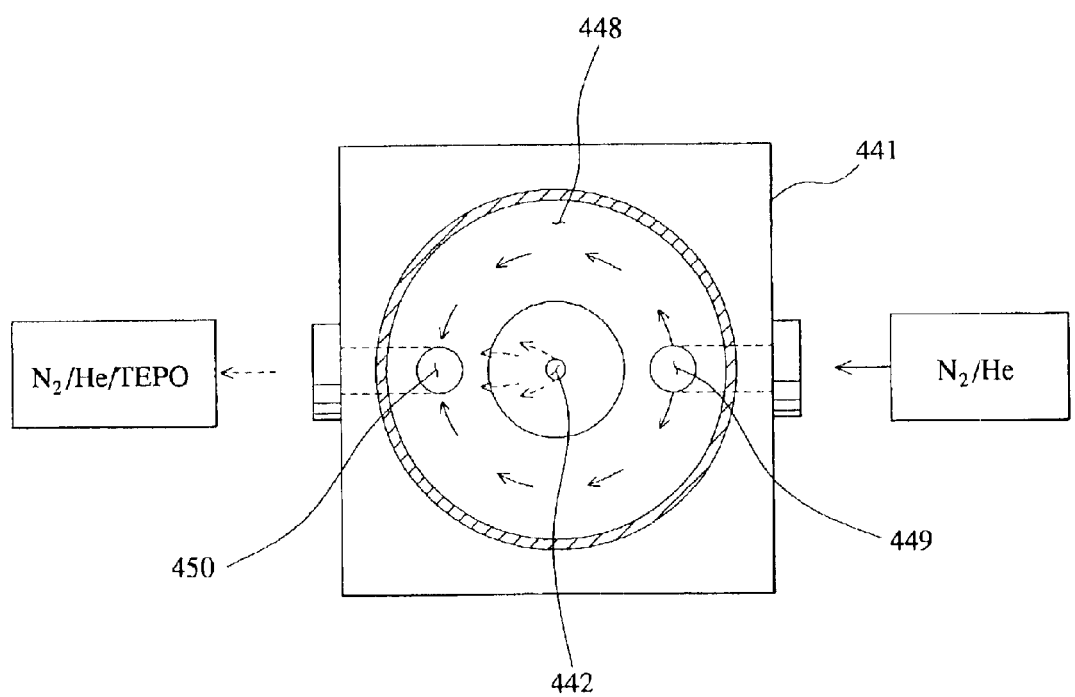
FIG. 3 is a plan view of the injection valve in accordance with the present invention.

As shown in FIGS. 2 and 3, the injection valve 440 includes a valve body 441, and a valve block 443 coupled to the valve body 441 with a sealing member 451 interposed therebetween. The valve body 441 has a carrier gas inlet passage 449 extending therethrough from one side surface to an upper surface thereof. That is, the gas inlet passage 449 defines two openings, one at a side wall and the other at an upper surface of the valve body 441. Furthermore, the valve body 441 has a gas outlet passage 450 extending therethrough from another side surface to the upper surface thereof. Still further, a reactive gas flow line 442 extends through the center of the valve body 441 from the bottom to the top thereof. The reactive gas, namely the TEPO in its liquid phase, is supplied to the valve block 443 of the injection valve 440 by way of the liquid flow meter 430 and the reactive gas flow line 442.

The valve block 443 has an opening at a central portion where the valve body 441 and the reactive gas flow line 442 are exposed. A diaphragm 446 is disposed on the valve body 441 at this central portion. A spring 447 surrounds the diaphragm 446 as interposed between a laterally extending protrusion of the diaphragm and the valve block 443 and supported by the valve block 443. Hence, the spring 447 exerts an elastic force on the upper part of the diaphragm 446. In addition, a stack of piezo-electric elements 445 is disposed on the diaphragm 446. A housing 444 packages the diaphragm 446, the spring 447 and the piezo-electric stack 445. A small space between the valve body 441 and the reactive gas flowing line 442 and the diaphragm 446 provides a gasifying room 448 in which the liquid phase of the reactive gas is gasified.

The operation of the injection valve 440 will now be described.

First, a reactive gas is supplied through the reactive gas flow line 442 and the piezo-electric stack 445 drives the diaphragm 446 upwardly in response to a voltage level generated in response to a signal issued from the liquid flow meter 430. Hence, the reactive gas in its liquid phase enters the gasifying room 448 and is gasified therein. Next, the reactive gas is forced through the gas outlet passage 450 by a carrier gas supplied through the gas inlet passage 449.

The position of the diaphragm 446 is dictated by the level of the voltage applied to the piezo-electric stack 445 to control the flow rate of the reactive gas. The voltage that is impressed across the piezo-electric stack depends on a signal issued by the liquid flow meter 430.

A pressure detecting device is disposed just upstream of each of the injection valves 240, 340, 440, and a respective switching valve 210, 310 or 410 is interposed between each of the second pressure detecting devices 200, 300, 400 and the injection valve 210, 310, 410 associated therewith.

The second pressure detecting device may be a mass flow meter or a pressure gauge. A preferred embodiment of the present invention adopts a mass flow meter as the pressure detecting device. A respective pair of the pressure detecting devices 200, 300, 400 and the switching valves 210, 310, 410 is provided for each reactive gas supplying device.

That is, the gas supplying apparatus in accordance with the present invention includes a mass flow meter 200 and a switching valve 210 connected to the TEB gas supplying device, a mass flow meter 300 and a switching valve 310 connected to the TEOS gas supplying device, and a mass flow meter 400 and a switching valve 410 connected to the TEPO gas supplying device. each of the mass flow meters 200, 300 and 400 will be referred to hereinafter as a second mass flow meter.

The gas supplying devices can be tested separately because a second mass flow meter and a switching valve are provided for each gas supplying device. The switching valve is a multi-position valve movable between open and closed positions. When an injection valve is being tested for clogs, the other gas supplying devices not being tested are shut down by moving the switching valves associated therewith to an OFF position.

A method of testing the injection valves for clogs will be described below.

First, the carrier gases $N_2$ and He are supplied to the first mass flow meter 130 disposed adjacent the carrier gas supplying device 100. Then, the carrier gases pass through three parallel gas flow lines located between the mass flow meter 130 and the reactive gas supplying devices. The carrier gases flow to the second mass flow meters 200, 300 and 400, and then to the reactive gas supplying devices.

Next, the reactive gases, i.e., TEB, TEOS and TEPO, are supplied from TEB gas source 220, TEOS gas source 320 and TEPO gas source 420 to corresponding injection valves 240, 340 and 440 by way of the second liquid flow meters 230, 330, 430, respectively. Each of the reactive gases is gasified in the injection valves 240, 340 and 440 and then supplied to the process chamber 500, thereby forming a layer on a wafer situated within the process chamber 500.

However, the gas outlet passages of the injection valves 240, 340 and 440 may become clogged. If at least one injection valve is clogged, the ratio of the reactive gas mixture supplied into the process chamber is different from a predetermined ratio. In this case, a layer having undesired characteristics will be formed on the wafer.

Accordingly, the injection valves have to be tested for clogs.

Figure 4:
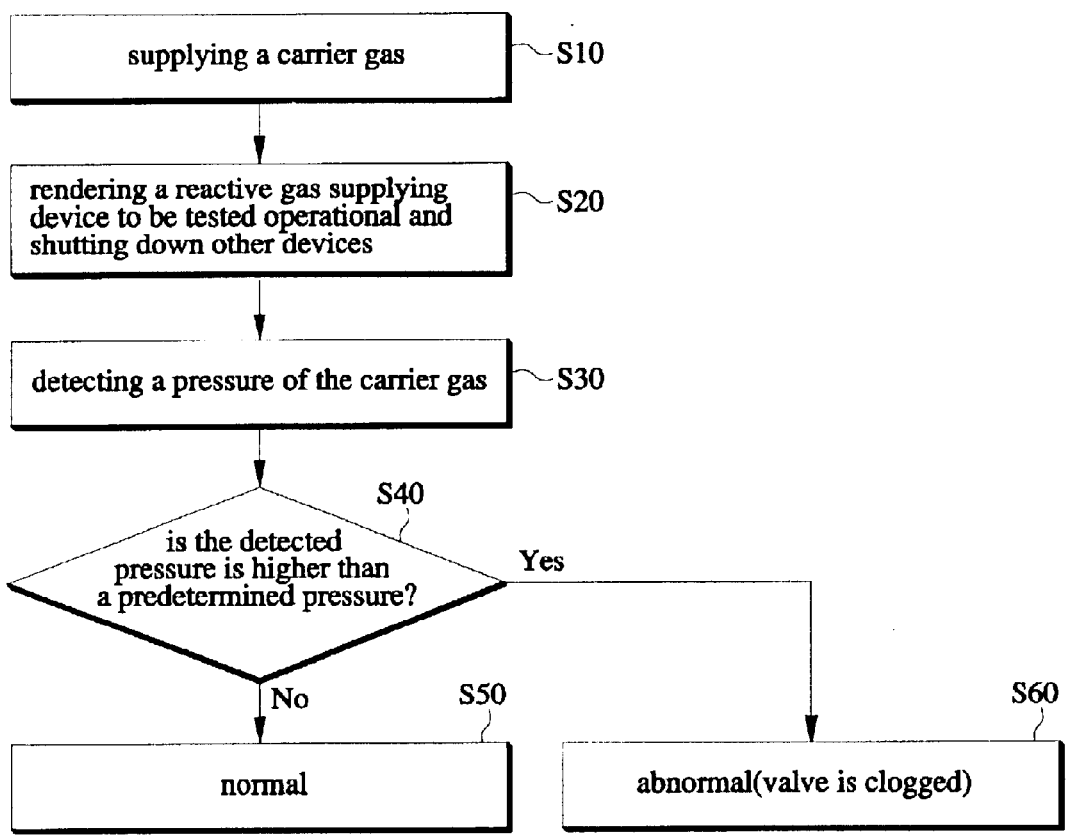
FIG. 4 is a flow chart showing a method for testing an injection valve for clogs in accordance with the present invention.

FIG. 4 illustrates a method of testing an injection valve for clogs in accordance with the present invention.

First, as described above, the carrier gas supplying device 100 supplies carrier gases under a predetermined pressure to a plurality of reactive gas supplying devices. The pressure is detected by a first mass flow meter 130 installed near the carrier gas supplying device (Step S10).

Next, the switching valve associated with a gas supplying device to be tested is turned on whereas the switching valves associated with the other gas supplying devices not to be tested are off. For example, the switching valve 210 associated with the TEB gas supplying device and the switching valve 310 associated with the TEOS gas supplying device are turned off but the switching valve 410 associated with the TEPO gas supplying device is turned on (Step S20).

Next, a pressure detecting device, e.g. a second mass flow meter 400, adjacent the TEPO gas supplying device to be tested detects the pressure of the carrier gases (Step S30).

Next, the pressures detected by the first mass flow meter and the second mass flow meter are compared to each other. The pressure detected by the first mass flow meter will be referred to as a predetermined pressure (Step S40).

When the pressure detected by the second mass flow meter 400 is higher than the predetermined pressure, the injection valve 440 is determined to be operating abnormally. In other words, the injection valve 440 is deemed to be clogged (Step S60). When the pressure detected by the second mass flow meter 400 is the same or lower than the predetermined pressure, the injection valve 440 is determined to be operating normally. This means that the injection valve 400 is not clogged (Step S50).

However, the testing may have a margin for error. The margin for error depends on the size and features of the gas flow line connecting the carrier gas supplying device and the reactive gas supplying device. Accordingly, the margin for error has to be considered in determining whether the injection valve is clogged.

Finally, the other injection valves 240, 340 can be tested in turn in the same way that the injection valve 440 is tested. After all of the injection valves 240, 340 and 440 are tested, any clogged injection valve should be replaced.

Although the present invention has been described in detail with respect to the preferred embodiments thereof, various changes and modifications will be apparent to those skilled in the art. For instance, although the present invention has been described in connection with a CVD apparatus, the present invention can be applied to other semiconductor device fabrication apparatus including gas supplying apparatus. Accordingly, all such changes and modifications are seen to be within the true spirit and scope of the invention as defined by the appended claims.

What is claimed is:

1. A gas supplying apparatus, comprising:
a carrier gas supplying device including a source of at least one carrier gas used for carrying a reactive gas;
at least one reactive gas supplying device that includes a source of a reactive gas, and a mechanism to gasify the reactive gas;
a gas flow line connecting an inlet of said at least one reactive gas supplying device to an outlet of the carrier gas supplying device such that carrier gas flows from the carrier gas supplying device through said line and into the at least one reactive gas supplying device and thereby entrains the gasified reactive gas; and
a pressure detecing device disposed in the gas flow line downstream of the carrier gas supplying device and adjacent the inlet of the reactive gas supplying device with respect to the flow of the carrier gas in the apparatus so as to detect the pressure of the carrier gas prior to the carrier gas entering said reactive gas supplying device.

2. The gas supplying apparatus of claim 1, wherein said at least one reactive gas supplying device comprises a plurality of reactive gas supplying devices connected in parallel to each other, and a respective said pressure detecting device is connected to each of the reactive gas supplying devices.

3. The gas supplying apparatus of claim 2, wherein the reactive gas supplying devices comprise a TEOS gas supplying device including a source of Tetra-Ethyl-Ortho-Silicate, a TEB gas supplying device including a source of Tri-Ethyl-Boron, and a TEPO gas supplying device including a source of Tri-Ethyl-Phosphorous.

4. The gas supplying apparatus of claim 1, wherein said pressure detecting device comprises a mass flow meter.

5. The gas supplying apparatus of claim 1, wherein said pressure detecting device comprises a pressure guage.

6. The gas supplying apparatus of claim 1, and further comprising a switching valve movable between an open position and a closed position, and disposed in the gas flow line between the reactive gas supplying device and the pressure detecting device.

7. The gas supplying apparatus of claim 1, wherein
the source of reactive gas of each said at least one reactive gas supplying device comprises a source of reactive gas in its liquid phase, and said mechanism comprises an injection valve that controls the flow rate of the liquid phase of the reactive gas from the reactive gas source and gasifies the reactive gas, said injection valve having a carrier gas inlet to which said gas flow line is connected, and a reactive gas flow line connected to said source of reactive gas, said pressure detecting device being disposed in said gas flow line adjacent the carrier gas inlet of said injection valve.

8. The gas supplying apparatus of claim 1, and further comprising a first pressure detecting device connected to said carrier gas supplying device so as to detect the pressure of the carrier gas issuing from said carrier gas supplying device upstream of said pressure detecing device disposed in the gas flow line.

* * * * *